United States Patent [19]

Morita et al.

[11] Patent Number: 4,564,579

[45] Date of Patent: Jan. 14, 1986

[54] PATTERN FORMING MATERIAL OF A SILOXANE POLYMER

[75] Inventors: Masao Morita; Akinobu Tanaka; Saburo Imamura, all of Mito; Toshiaki Tamamura, Katsuta; Osamu Kogure, Mito, all of Japan

[73] Assignee: Nippon Telegraph & Telephone Public Corporation, Tokyo, Japan

[21] Appl. No.: 680,739

[22] Filed: Dec. 12, 1984

Related U.S. Application Data

[62] Division of Ser. No. 580,468, Feb. 15, 1984, Pat. No. 4,507,384.

[30] Foreign Application Priority Data

Apr. 18, 1983 [JP] Japan .................... 58-66892
Apr. 18, 1983 [JP] Japan .................... 58-66893
Jul. 11, 1983 [JP] Japan .................... 58-124766

[51] Int. Cl.$^4$ ........................... G03C 5/00
[52] U.S. Cl. .................... 430/270; 430/311; 430/322; 430/325; 204/159.13; 528/26; 528/42
[58] Field of Search ........... 204/159.13; 528/26, 528/42; 430/270, 311, 312, 313, 322, 325

[56] References Cited

U.S. PATENT DOCUMENTS 3,741,932 6/1973 Smith et al. .................. 204/159.13
3,813,364 5/1974 DeZuba et al. ............... 204/159.13

OTHER PUBLICATIONS

"Double Layer Resist Systems for High Resolution Lithography", Hatzakis et al., IBM Thomas J. Watson Research Center, Sep. 1981.

*Primary Examiner*—Jack P. Brammer

*Attorney, Agent, or Firm*—Frishauf, Holtz, Goodman & Woodward

[57] ABSTRACT

A pattern forming material contains a siloxane polymer having the general formula:

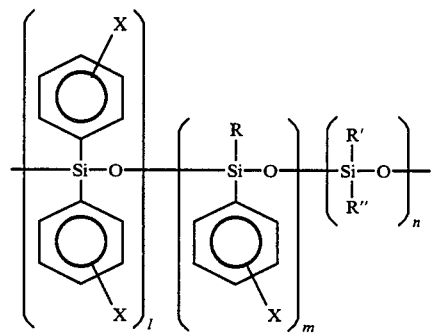

[wherein R, R' and R" are the same or different and are respectively one member selected from hydrogen, an alkyl group or a phenyl group; X is one member selected from fluorine, chlorine, bromine, iodine and a —CH$_2$Y group (wherein Y is one member selected from chlorine, fluorine, bromine, iodine, an acryloyloxy group, a methacryloyloxy group, and a cinnamoyloxy group); and l, m and n are respectively 0 or a positive integer, l and m not being simultaneously 0]. The material has a high sensitivity to high-energy radiation, a high contrast, and an excellent resistance to reactive ion etching under oxygen gas. The material is conveniently used as a negative resist for forming a submicron pattern having a high aspect ratio.

6 Claims, 3 Drawing Figures

F I G. 1
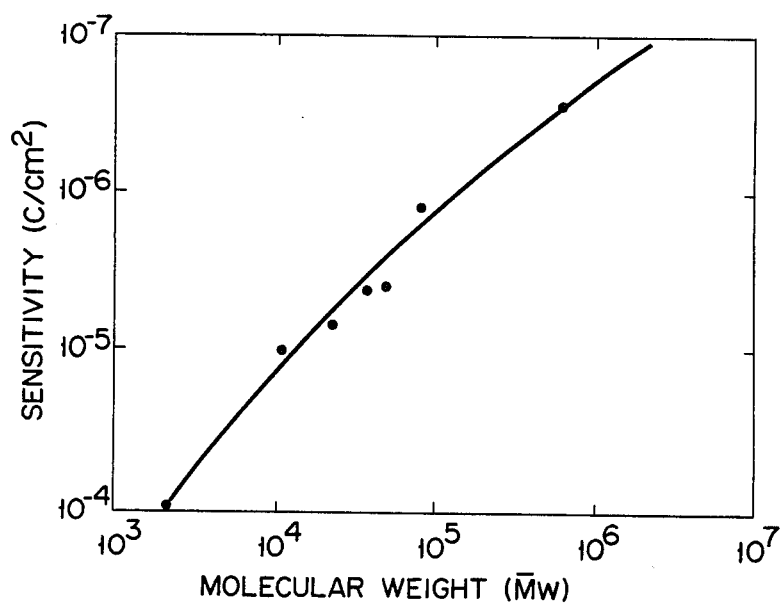
F I G. 3
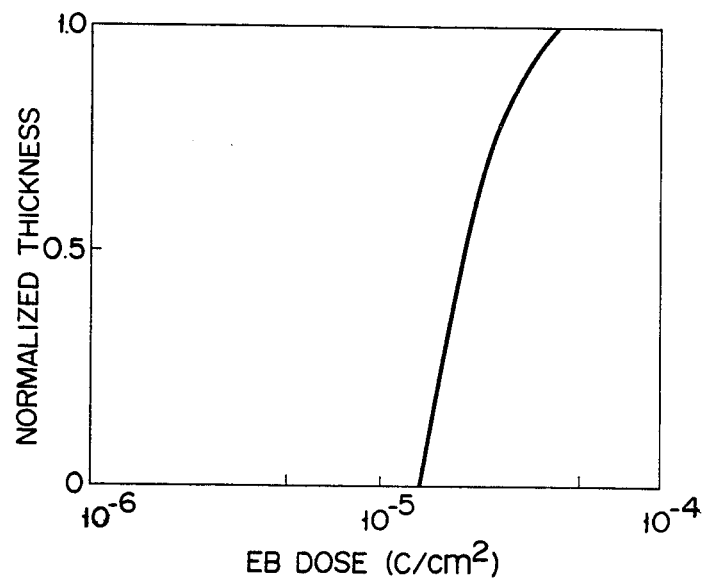

PATTERN FORMING MATERIAL OF A SILOXANE POLYMER

This is a division of application Ser. No. 580,468 filed Feb. 15, 1984, now U.S. Pat. No. 4,507,384.

BACKGROUND OF THE INVENTION

The present invention relates to a pattern forming material and, more particularly, to a silicone based negative resist, and to a method for forming a submicron pattern having a high aspect ratio using such a resist.

In the manufacture of ICs and LSIs, organic compositions containing a polymeric compound and called a resist are frequently used. More specifically, a substrate to be processed is covered with a selected organic composition as a resist film. The resist film is irradiated with a high-energy beam in a predetermined pattern to form an electrostatic latent image in the resist film. Development is then performed to form a patterne resist film. Thereafter, the substrate is immersed in an etching solution to chemically etch the exposed portion of the substrate which is uncovered by the resist pattern, or to dope an impurity therein.

However, with a recent tendency toward higher integration of IC circuits, further minimization is desired. In wet etching methods using an etching solution, the problem of side etching is inevitable. In view of this problem, dry etching such as reactive ion etching using a gas plasma is becoming popular. However, conventional resist materials are themselves etched during dry etching of the substrate; thus the resist film must be thick to allow selective etching of the substrate. For this reason, a resist material with a high dry etching resistance has been desired. However, a resist material which is satisfactorily resistant to dry etching has not yet been proposed.

Meanwhile, in order to provide a multilayered wiring layer or a semiconductor element of a three-dimensional array structure, it is desired to form a resist pattern on a nonplanar substrate. The resist film must be made thick to level a step.

Furthermore, in order to trap highly accelerated ions before they reach the substrate, the resist film must again be thick. However, with a conventional resist material, resolution is lowered as the film thickness increases, preventing formation of a fine pattern.

In order to solve this problem, a method has been proposed wherein a resist is applied in a multilayered structure to form a resist pattern having a high aspect ratio. According to such a method, a thick film of an organic polymeric material is formed as a first layer. A thin resist material film is formed thereover as a second layer. The second, resist layer is selectively irradiated with a high-energy beam and is developed. The resultant pattern is used as a mask to dry etch the organic polymeric material of the first layer and to form a pattern of a high aspect ratio. With this method, when a conventional resist material is used for the second layer, the ratio of dry etch rates of the materials of the first and second layers, that is, the selectivity, cannot be set to be high. Akiya et al (article to be published in 43rd Proceedings of the Japan Association of Applied Physics, p. 213) reported that when a multilayer pattern consisting of a first layer of polymethyl methacrylate (to be referred to as PMMA hereinafter) and a second layer of chloromethylated polystyrene is dry etched using carbon tetrachloride as an etching gas, the selectivity can be selected to be very high and a resist pattern having a high aspect ratio can be formed. However, in this case, the etch rate of the PMMA is also low; it takes a long time to etch a thick PMMA film. Carbon tetrachloride as an etchant also etches the underlying substrate.

A three-layered structure has also been proposed as a multilayered resist pattern obtained using an oxygen plasma, and consists of a first, thick layer of an organic polymeric material, a second layer of a resist, and a third layer which consists of an inorganic material having a high resistance to the oxygen plasma and formed between the first and second layers. In this case, the pattern of the resist material is used as a mask to dry etch the inorganic material using a gas such as carbon tetrachloride, carbon tetrafluoride or argon. Subsequently, using the resultant inorganic material pattern as a mask, the organic polymeric material layer is dry etched using oxygen. With this method, the oxygen plasma can quickly etch the first, thick organic polymeric material layer and the substrate is not etched at all. Accordingly, a resist pattern of a desired profile may be formed without requiring monitoring of the end timing of etching. However, this method requires a large number of steps.

When a silicone based resist having a high resistance to dry etching using an oxygen plasma is used for the second layer, an oxygen plasma can be used to dry etch the organic polymeric material of the first layer, using the resist pattern of the second layer as a mask. For this reason, a resist pattern of a high aspect ratio can be formed within a short period of time and with a small number of steps. However, a currently available silicone based resist has a glass transition temperature considerably lower than room temperature. A conventional silicone based resist having a low molecular weight is in liquid or milky form, is difficult to handle, and has a low sensitivity to high-energy radiation.

On the other hand, a conventional silicone based resist having a high molecular weight is in a rubbery form, is easier to handle, and has a higher sensitivity to high-energy radiation. However, the resultant pattern frequently has an undulation due to swelling in a developing solvent, resulting in a low resolution. Furthermore, a functional group having a high chain reaction property such as a vinyl group is introduced to improve sensitivity of the cross-linking reaction. This also results in a low resolution.

SUMMARY OF THE INVENTION

The present invention has been made in consideration of this and has for its object to provide a high-energy radiation-sensitive, negative resist which has a high sensitivity, a high resolution, and a high dry etching resistance, and a method for forming a pattern with such a negative resist.

According to an aspect of the present invention, there is provided a pattern forming material containing a siloxane polymer having the general formula:

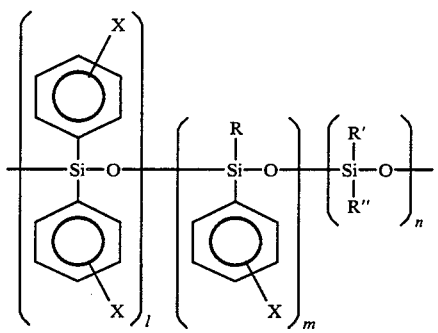

[wherein R, R' and R" are the same or different and are respectively one member selected from the group consisting of hydrogen, an alkyl group and a phenyl group; X is one member selected from the group consisting of fluorine, chlorine, bromine, iodine and a —$CH_2Y$ group (wherein Y is one member selected from the group consisting of chlorine, fluorine, bromine, iodine, an acryloyloxy group, a methacryloyloxy group, and a cinnamoyloxy group); and l, m and n are respectively 0 or a positive integer, l and m not being simultaneously 0].

According to an another aspect of the present invention, there is also provided a method for forming a pattern, comprising the steps of forming a high-energy radiation-sensitive material film on a substrate; selectively irradiating a surface of the high-energy radiation-sensitive material film with a high-energy beam; and removing by developing a non-irradiated portion of the high-energy radiation-sensitive material film with a developing solvent, wherein the high-energy radiation-sensitive material is a siloxane polymer having the above-mentioned general formula.

According to still another aspect of the present invention, there is also provided a method for forming a pattern, comprising the steps of forming an organic polymeric material layer on a substrate; forming a high-energy radiation-sensitive material film thereover; selectively irradiating a surface of the high-energy radiation-sensitive material film so as to cross-link a high-energy radiation-sensitive material at an irradiated portion of the high-energy radiation-sensitive material film; removing a non-irradiated portion of the high-energy radiation-sensitive material film using an organic developing solvent; and etching a portion of the organic polymeric material layer not covered with the remaining, irradiated portion of the high-energy radiation-sensitive material film by dry etching using oxygen and the remaining, irradiated portion as a mask, thereby forming a pattern of the organic polymeric material layer, wherein the high-energy radiation-sensitive material contains a siloxane having the above-mentioned general formula.

BRIEF DESCRIPTION OF THE DRAWINGS

FIG. 1 is a graph showing the relationship between molecular weight and sensitivity;

FIG. 3 is a graph showing the relationship between the electron beam dose and the normalized remaining film proportion, which represents the electron beam sensitivity of a resist pattern formed by a method of the present invention.

DETAILED DESCRIPTION OF THE PREFERRED EMBODIMENTS

Figure 2:
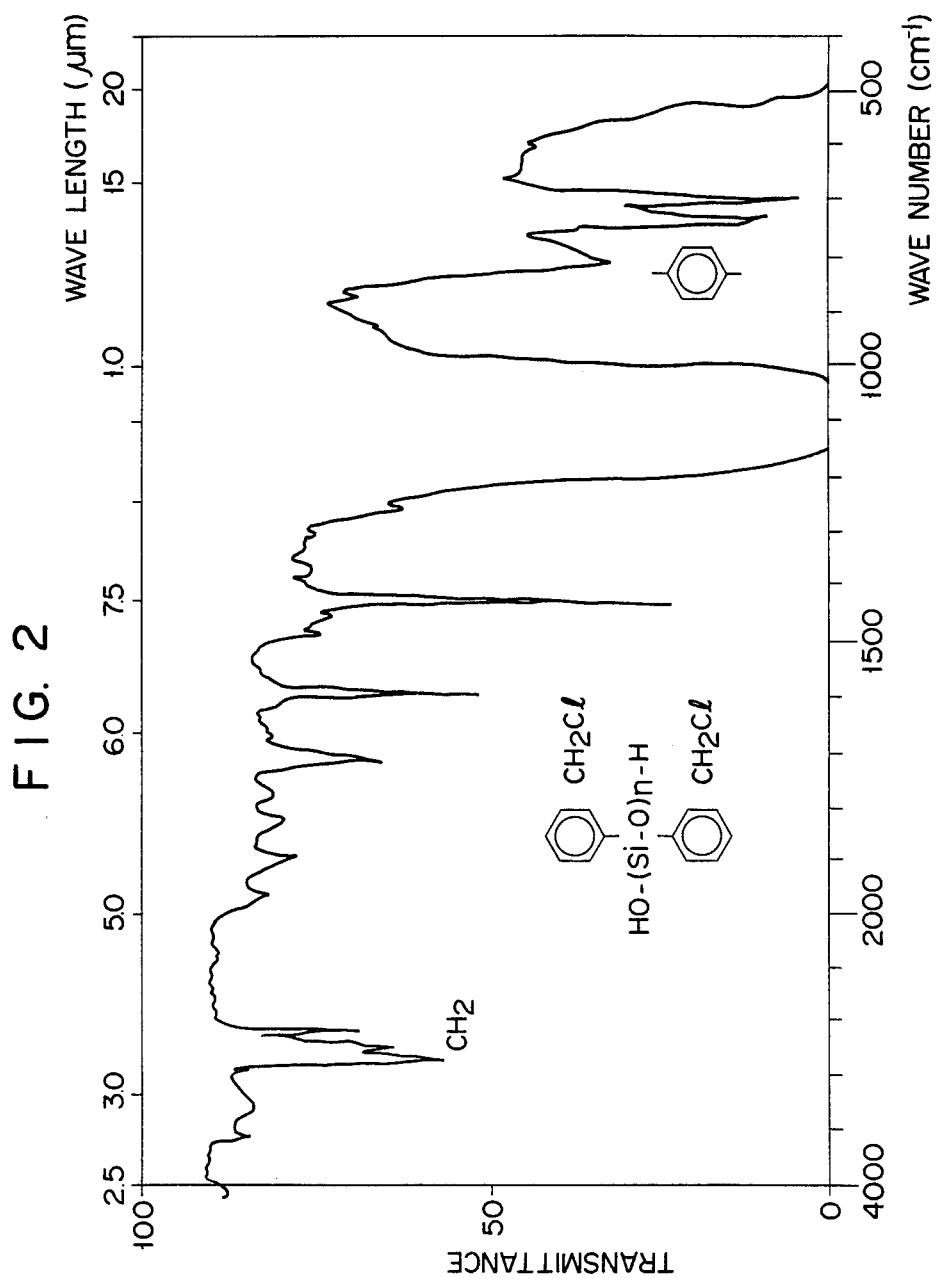
FIG. 2 is a graph showing an infrared absorption spectrum of a siloxane polymer prepared in Working Example 1 of the present invention.

The alkyl group in the general formula of the polysiloxane of the present invention can be a methyl group, an ethyl group, a propyl group or the like. In order to increase a glass transition temperature Tg, the content of the phenyl group in the general formula is preferably 75% or more of the side chain residues.

The content of the phenyl group in which a functional group (X in the above-mentioned general formula) is introduced, is preferably 20% or more of the side chain residues. Sensitivity increases with an increase in the weight average molecular weight. FIG. 1 is a graph showing the relationship between the molecular weight and a minimum exposure as an index of sensitivity. In FIG. 1, the weight average molecular weight $\overline{Mw}$ is plotted along the axis of abscissa, and sensitivity ($C/cm^2$) is plotted along the axis of ordinate. As can be seen from FIG. 1, since the sensitivity preferably decreases within a range of $10^{-4}$ to $10^{-7}$ $C/cm^2$, the molecular weight preferably increases within a range of $2 \times 10^3$ to $2 \times 10^6$.

The most important feature of the present invention is that a high-energy radiation-sensitive material having a high sensitivity and high resolution is obtained by introducing a functional group X into a silicone polymer having a phenyl group, such as polyphenylmethylsiloxane or polydiphenylsiloxane. The phenyl group-containing silicone polymer exhibits a high resistance not only to oxygen gas but also to an etchant gas used in reactive ion etching such as $CCl_4$ or $CF_2Cl_2$. A silicone based polymer of which the content of the phenyl group is 75% or more is solid at room temperature and is soluble in an organic solvent such as toluene, xylene, methyl ethyl ketone, methyl isobutyl ketone, or monochlorobenzene. When a solution of such a silicone based polymer is applied to a substrate by spin coating, an excellent film can be formed. This excellent solubility of a silicone based polymer containing a phenyl group allows selection from a wide variety of coating solvents or developing solvents in accordance with the material of the substrate. This excellent solubility of a silicone based polymer containing a phenyl group is not impaired upon introduction of a functional group X. Accordingly, in contrast to a conventional silicone based resist which is in a rubbery form, the silicone based resist of the present invention is easy to handle. The constituent components, features and effects of the silicone polymer of the present invention may be summarized as in Table 1 below.

TABLE 1

| Constituent component | Feature | Effect |
|---|---|---|
| Siloxane skeleton 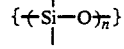 | Highly resistant to oxygen dry etching | Only a thin film pattern need be formed for dry etching an underlying polymer. High resolution is obtained due to such small thickness of the film pattern. |
| Phenyl group 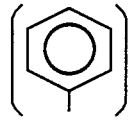 | High glass transition temperature (Tg) | General silicone has a Tg lower than room temperature and has a rubbery or liquid form. The material of the present invention has a Tg higher than 150° C. and is in a form equivalent to a conventional resist. Handling is easy and high resolution is obtained. |
| Functional group | Forms network structure at low exposure | High sensitivity |

Regarding a method for preparing a polymer having the above-mentioned general formula, a method may be adopted wherein a cyclic phenylsiloxane such as hexaphenylcyclotrisiloxane or octaphenylcyclotetrasiloxane is subjected to ring-opening polymerization by a hydroxide of an alkali metal such as potassium hydroxide or an alkylate of an alkali metal such as butyl lithium, and a functional group X is introduced into the resultant polydiphenylsiloxane. A cyclic phenylsiloxane may be used singly or may be copolymerized with tetramethyltetraphenylcyclotetrasiloxane or octamethylcyclotetrasiloxane. When it is desired to form a pattern of high resolution, a monodisperse polymer must be prepared wherein the molecular weight of the dispersed particles is uniform. Such a monodisperse polymer may be prepared by subjecting a cyclohexane to anionic living polymerization by a catalyst such as butyl lithium and introducing a functional group X into the resultant polymer.

The siloxane polymer having the above-mentioned general formula may be prepared by reacting a phenyl group-containing siloxane oligomer or a phenyl group-containing polysiloxane having a small molecular weight with a group X in the above-mentioned general formula or a compound containing X under the presence of a Friedel-Crafts catalyst.

A siloxane polymer containing a chloromethyl group may be prepared by reacting a phenyl group-containing siloxane oligomer or a phenyl group-containing polysiloxane having a small molecular weight with a chloromethyl lower alkyl ether under the presence of a Friedel-crafts catalyst.

The raw material to be used in the preparation of the siloxane polymer as described above can be a polyphenyl group-containing siloxane having a small molecular weight, which is prepared by polymerizing with an acid or an alkali a phenyl group-containing cyclic silicone oligomer such as hexaphenylcyclotrisiloxane or octaphenylcyclotetrasiloxane. Alternatively, there may be employed a phenyl group-containing siloxane oligomer such as polydiphenylsiloxane or polydimethyldiphenylsiloxane. A Friedel-Crafts catalyst to be used herein can be a general Friedel-Crafts catalyst such as aluminum chloride, ferric chloride, boron trifluoride, zinc chloride, stannic chloride, or titanium tetrachloride. The chloromethyl lower alkyl ether can be chloromethyl methyl ether, chloromethyl ethyl ether or the like.

The siloxane polymer having the above-mentioned general formula is prepared by dissolving a phenyl group-containing siloxane oligomer or a phenyl group-containing polysiloxane having a small molecular weight in a chloromethyl lower alkyl ether, adding a Friedel-Crafts catalyst to the resultant solution, and reacting the solution at a reaction temperature falling within the range from −10° C. to room temperature. The reaction can be performed in a solvent such as carbon tetrachloride or trichloroethane.

The reaction is terminated after 30 minutes to 30 hours, precipitation in methanol is performed, and reprecipitation is repeated in a ketone-alcohol system. A molecular weight of the phenyl group-containing polysiloxane can be controlled in accordance with the raw material concentration, catalyst temperature, reaction temperature, and reaction time.

Polymerization may be attributed to the following four factors. (1) As chloromethylation progresses, the chloromethyl group is molecular cross-linked with a nonsubstituted phenyl group. (2) Molecular cross-linking is caused by the reaction between the OH group at the terminal end and the chloromethyl group. (3) Dehydration condensation between the OH groups at the terminal ends is caused by the presence of the Friedel-Crafts catalyst. (4) Cross-linking between the OH group at the terminal end and the phenyl group is caused by the presence of the Friedel-Crafts catalyst.

The siloxane polymer of the present invention has a high glass transition temperature and can form a uniform film. Furthermore, the siloxane polymer of the present invention contains a chloromethyl group having a high sensitivity to high-energy radiation such as an electron beam, has a phenyl group resistant to a gas plasma such as carbon tetrachloride or carbon tetrafluoride, and has a siloxane structure highly resistant to an oxygen gas plasma. Accordingly, the siloxane polymer of the present invention can be used as a high-energy radiation-sensitive resist material.

The developing solvent to be used in a method for forming a pattern according to the present invention can be a ketone such as methyl ethyl ketone, diisobutyl ketone, or methylisobutyl ketone; an aromatic hydrocarbon such as benzene, toluene, xylene, or monochlorobenzene; an ester such as ethyl acetate, n-amyl acetate, isoamyl acetate, methyl cellosolve acetate, or ethyl cellosolve acetate; a cellosolve such as methyl cellosolve or ethyl cellosolve; a mixture thereof with an alcohol, e.g., methanol, ethanol or isopropyl alcohol, or with an aliphatic hydrocarbon such as cyclohexane, n-hexane or n-heptane.

Working Examples for preparation of a high-energy radiation-sensitive material and a raw material thereof, and a method for forming a pattern using the thus prepared material will now be described.

WORKING EXAMPLE 1

A glass tube was charged with 50 g of octaphenylcyclotetrasiloxane, 100 ml of tetrahydrofuran and 250 mg of potassium hydroxide. After the tube was degassed and sealed, the reaction was performed at a polymerization temperature of 70° C. for 24 hours. The contents of the tube were poured into a water/methanol (1:4) solution to provide a white polymer. The polymer was purified by repeated reprecipitation in a methanol-xylene system. The resultant polydiphenylsiloxane was found to have a weight average molecular weight $\overline{Mw}$ of $1.3 \times 10^3$, a molecular weight distribution $\overline{Mw}/\overline{Mn}$ of 2.6 and a glass transition temperature of 150° C.

Twenty grams of the polydiphenylsiloxane were dissolved in 500 ml of a chloromethyl ether, and the reaction was performed using 20 ml of stannic chloride as a catalyst at a temperature of $-5°$ C. for 10 hours. The reaction solution was poured into the methanol to provide a white polymer. FIG. 2 shows the infrared absorption spectra of the polymer. Referring to FIG. 2, the number of waves (cm$^{-1}$) or the wavelength ($\mu$m) is plotted along the axis of abscissa, and the transmittance is plotted along the axis of ordinate. As may be seen from FIG. 2, absorption due to the presence of the disubstituted phenyl is observed at 800 cm$^{-1}$, and absorption due to the presence of the methylene group of the chloromethyl group is observed at 2,200 cm$^{-1}$, thus confirming the chloromethylation. Elemental analysis of the polymer revealed that the polymer had a degree of chloromethylation of 20%. From gel permeation chromatography, it was found that the polymer had a weight average molecular weight $\overline{Mw}$ of $1.2 \times 10^4$ and a molecular weight distribution $\overline{Mw}/\overline{Mn}$ of 1.8, providing a molecular weight increase of about 10-fold.

WORKING EXAMPLE 2

Twenty-five grams of the polydiphenylsiloxane obtained in Working Example 1 were dissolved in 500 ml of a chloromethyl methyl ether. The solution was reacted at $-5°$ C. for 12 hours using 25 ml of stannic chloride as a catalyst. The reaction solution was poured into methanol to provide a white, solid polymer. Elemental analysis of the polymer revealed that the polymer had a degree of chloromethylation of 17%. The polymer had a weight average molecular weight $\overline{Mw}$ of $4.7 \times 10^4$ and a molecular weight distribution $\overline{Mw}/\overline{Mn}$ of 3.5, providing a molecular weight increase of about 40-fold.

WORKING EXAMPLE 3

A polymer was prepared using a mixture of tetraphenyltetramethylcyclotetrasiloxane and octaphenylcyclotetrasiloxane in place of the octaphenylcyclotetrasiloxane in Working Example 1, while varying the mixing ratios. Chloromethylation was performed under the conditions of Working Example 2. Table 2 shows the phenyl group content, glass transition temperature and molecular weight.

TABLE 2

| Sample No. | Phenyl group content (%) | Glass transition temperature (°C.) | Degree of chloromethylation | Molecular weight ($\times 10^4$) |
|---|---|---|---|---|
| 1 | 100 | 160 | 45 | 1.2 |
| 2 | 85 | 100 | 43 | 3.4 |
| 3 | 75 | 30 | 33 | 2.0 |
| 4 | 50 | −20 | 21 | 1.1 |

WORKING EXAMPLE 4

Ten grams of hexaphenylcyclotrisiloxane were added to 3.7 ml of highly concentrated sulfuric acid and 10 ml of diethyl ether, and the resultant mixture was stirred at room temperature for 24 hours. Twenty milliliters of diethyl ether and 10 ml of water were added to the mixture, and the resultant mixture was stirred again for 1 hour. After removing the lower layer of water and drying the upper layer product with anhydride potassium carbonate, the product was heated under reflux at 300° C. for 3 hours. The ether was evaporated to provide a white solid material. The solid material was purified by reprecipitation with a methyl ethyl ketone-methanol solution to provide a polydiphenylsiloxane having a weight average molecular weight $\overline{Mw}$ of $1.9 \times 10^4$ and a molecular weight distribution $\overline{Mw}/\overline{Mn}$ of 2.1.

WORKING EXAMPLE 5

Ten grams of hexaphenylcyclotrisiloxane were dissolved in 100 ml of toluene. After sufficient degassing and dehydration, 5 ml of a 10% solution of butyl lithium in toluene were added dropwise to perform living polymerization at $-60°$ C. for 10 hours. The reaction solution was poured into methanol to provide a white, solid polymer. The polymer was repeatedly reprecipitated in a methyl ethyl ketone-methanol solution to be purified, and was then vacuum dried. The weight average molecular weight $\overline{Mw}$ and the molecular weight distribution $\overline{Mw}/\overline{Mn}$ of the polymer determined by gel permeation chromatography were $8.9 \times 10^3$ and 1.1, respectively.

WORKING EXAMPLES 6 & 7

The polydiphenylcyclosiloxane (Working Example 6) obtained in Working Example 4 and the polydiphenylsiloxane (Working Example 7) obtained in Working Example 5 were chloromethylated under the same reaction conditions and procedures as in Working Example 1. In Working Example 6, the resultant polymer had a degree of chloromethylation of 17%, a weight average molecular weight $\overline{Mw}$ of $3.1 \times 10^4$, and a molecular weight distribution $\overline{Mw}/\overline{Mn}$ of 2.5. In Working Example 7, the resultant polymer had a weight average molecular weight $\overline{Mw}$ of $2.2 \times 10^4$ and a molecular weight distribution $\overline{Mw}/\overline{Mn}$ of 1.3.

WORKING EXAMPLE 8

Chloromethylated polydiphenylsiloxanes having different degrees of chloromethylation were obtained by changing the amount of stannic chloride to be added in Working Example 1. Table 3 below shows the amount of stannic chloride added, the degree of chloromethylation, the weight average molecular weight, and the molecular weight distribution.

TABLE 3

| Sample No. | Amount stannic chloride added | Degree of chloromethylation | Weight average molecular weight | Dispersibility |
|---|---|---|---|---|
| 5 | 10 | 30 | $1.1 \times 10^4$ | 1.7 |
| 6 | 20 | 45 | $1.2 \times 10^4$ | 1.8 |
| 7 | 30 | 50 | $1.3 \times 10^4$ | 1.9 |
| 8 | 40 | 55 | $1.5 \times 10^4$ | 2.1 |

WORKING EXAMPLE 9

Polydiphenylsiloxanes having different molecular weights were prepared by varying the reaction temperature in Working Example 1. Subsequently, chloromethylated polydiphenylsiloxanes having different molecular weights and having the same degree of chloromethylation were obtained following the same procedures as those in Working Example 1. Table 4 below shows the molecular weights and degrees of chloromethylation of the polydiphenylsiloxanes, and the molecular weights and molecular weight distribution of the chloromethylated polydiphenylsiloxanes.

TABLE 4

| Sample No. | Temperature | Molecular weight of polydiphenylsiloxane | Degree of chloromethylation | Molecular weight of chloromethylated polydiphenylsiloxane | Molecular weight distribution |
|---|---|---|---|---|---|
| 9 | 40 | $0.7 \times 10^3$ | 41 | $0.9 \times 10^4$ | 1.6 |
| 10 | 70 | $1.3 \times 10^3$ | 46 | $1.2 \times 10^4$ | 1.8 |
| 11 | 100 | $5.8 \times 10^3$ | 45 | $3.3 \times 10^4$ | 1.9 |
| 12 | 140 | $9.6 \times 10^3$ | 47 | $6.2 \times 10^4$ | 2.1 |

EXAMPLE 1

The chloromethylated polydiphenylsiloxane obtained in Working Example 1 was dissolved in methyl isobutyl ketone. The resultant solution was coated on a silicon wafer with a thickness of about 0.5 μm, and the wafer was prebaked in a nitrogen flow at 100° C. for 20 minutes. After prebaking, the wafer was subjected to irradiation with an electron beam at an acceleration voltage of 20 kV. The wafer was then developed in a solvent mixture of methyl ethyl ketone:isobutyl alcohol (4:1), and was rinsed with isopropyl alcohol. FIG. 3 shows the relationship between the proportion of film remaining and the electron radiation dose. More specifically, FIG. 3 shows the electron radiation sensitivity characteristics of the resist pattern wherein the electron radiation dose (C/cm$^2$) is plotted along the axis of abscissa and the normalized proportion of remaining film is plotted along the axis of ordinate. As may be seen from this graph, the electron radiation dose at which 50% of the initial film thickness remains is $2.0 \times 10^{-5}$ C/cm$^2$, providing a practically satisfactory sensitivity. The γ-value, which is an index of resolution and which is a slope of the sensitivity curve, is as high as 2.5 as shown in FIG. 3. When the pattern after irradiation with an electron beam was rinsed with the developing solution of the same composition, no residue or bridge was formed in a 0.5 μm line-space pattern. Thus, a satisfactory resolution was obtained.

EXAMPLE 2

AZ-1350 resist (Shipley Co., Inc.) was applied on a silicon wafer to a thickness of 2 μm. The resist coating was heated at 200° C. for 30 minutes to be insoluble. The chloromethylated polydiphenylsiloxane obtained in Working Example 1 was coated to a thickness of about 0.3 μm as in Example 1, and the coating was prebaked in a nitrogen flow at 100° C. for 20 minutes. After prebaking, the polymer was irradiated with an electron beam at an acceleration voltage of 20 kV. The polymer was developed in a solvent mixture of methyl ethyl ketone:isopropyl alcohol (4:1) and was rinsed in isopropyl alcohol. As a result, a siloxane polymer pattern of 0.3 μm line/space was formed on the AZ resist. Etching was performed using oxygen gas as an etchant gas and using a parallel plate-type sputtering etching apparatus (50 W application power, and 80 millitorr oxygen gas internal pressure in the etching chamber). Under these etching conditions, the etch rate of the chloromethylated polydiphenylsiloxane was 0, and the etch rate of the AZ resist was 800 Å/min. The AZ resist pattern portion which was not covered with the chloromethylated polydiphenylsiloxane was completely etched away after etching for 28 minutes. After the etching process, a pattern of 0.3 μm line/space pattern was left to have a thickness of 2.3 μm.

EXAMPLES 3 TO 5

In the method of Example 1, irradiation was performed with an X-ray (Example 3), deep ultraviolet (Example 4), and an ion beam (Example 5), in place of the electron beam. Table 5 below shows the high-energy radiation doses at which 50% of the initial film thickness remained.

TABLE 5

| Example | Radiation source | High-energy radiation does |
|---|---|---|
| 1 | Electron beam: 10 kV acceleration voltage | $2.0 \times 10^{-5}$ C/cm$^2$ |
| 3 | X ray/CuL ray: 13.3 Å | 120 mJ/cm$^2$ |
| 4 | Deep ultraviolet 1 kW Xe-Hg lamp | 62 mJ/cm$^2$ |
| 5 | Ion beam Ga: 34 kV | $1.0 \times 10^{-6}$ C/cm$^2$ |

EXAMPLES 6–9

The chloromethylated polydiphenylsiloxane obtained in Working Example 8 was irradiated with an electron beam following the procedures of Example 1. Table 6 below shows the electron beam dose (sensitivity) at which 50% of the initial film thickness remained, and the γ-value.

TABLE 6

| Example | Degree of chloromethylation | Molecular weight | Sensitivity (C/cm$^2$) | γ-value |
|---|---|---|---|---|
| 6 | 30 | $1.1 \times 10^4$ | $2.0 \times 10^{-5}$ | 2.5 |
| 7 | 45 | $1.2 \times 10^4$ | $2.0 \times 10^{-5}$ | 2.5 |
| 8 | 50 | $1.3 \times 10^4$ | $1.9 \times 10^{-5}$ | 2.2 |
| 9 | 55 | $1.5 \times 10^4$ | $1.8 \times 10^{-5}$ | 2.1 |

EXAMPLE 10

The chloromethylated polydiphenylsiloxane obtained in Working Example 9 was irradiated with an electron beam following the procedures of Example 1. Table 7 below shows the electron beam dose (sensitivity) at which 50% of the initial thickness remained, and the γ-value.

TABLE 7

| Molecular weight | Sensitivity (C/cm$^2$) | $\gamma$-value |
| --- | --- | --- |
| $0.9 \times 10^4$ | $3.0 \times 10^{-5}$ | 2.7 |
| $1.2 \times 10^4$ | $2.0 \times 10^{-5}$ | 2.5 |
| $3.3 \times 10^4$ | $7.2 \times 10^{-6}$ | 2.1 |
| $6.2 \times 10^4$ | $3.1 \times 10^{-6}$ | 1.9 |

EXAMPLES 11–14

The pattern formed by the method in Example 1 was etched by RIE using CF$_4$ (Example 11), CCl$_4$ (Example 12), CCl$_2$F$_2$ (Example 13), and Ar (Example 14). Table 8 below shows the etch rates for the respective Examples.

TABLE 8

| Example | Etching gas | Etching conditions | Etch rate |
| --- | --- | --- | --- |
| 11 | CF$_4$ | 30 millitorr pressure × 0.5 W/cm$^2$ power | 10 Å/min |
| 12 | CCl$_4$ | 20 millitorr pressure × 0.5 W/cm$^2$ power | 0 Å/min |
| 13 | CCl$_2$F$_2$ | 40 millitorr pressure × 0.7 W/cm$^2$ power | 0 Å/min |
| 14 | Ar | 30 millitorr pressure × 0.3 W/cm$^2$ power | 0 Å/min |

WORKING EXAMPLE 10

Ten grams of a hexaphenylcyclotrisiloxane were dissolved in 100 ml of toluene. After sufficient degassing and sealing, 5 ml of a 10% solution of butyl lithium in toluene was dropwise added, and living polymerization was performed at −60° C. for 24 hours. The reaction solution was poured into methanol to provide a white, solid diphenylsiloxane polymer. The polymer was repeatedly precipitated in a methyl ethyl ketone-methanol solution to be purified, and was vacuum dried. The polymer has a weight average molecular weight $\overline{Mw}$ of $1.9 \times 10^4$ and a molecular weight distribution $\overline{Mw}/\overline{Mn}$ of 1.1.

WORKING EXAMPLE 11

Twenty grams of the polydiphenylsiloxane prepared in Working Example 10 were dissolved in 500 ml of chloromethyl methyl ether. The solution was reacted at a temperature of −5° C. for 10 hours using 20 ml of stannic chloride as a catalyst. The reaction solution was then poured into methanol to provide a white, solid chloromethylated diphenylsiloxane polymer. Infrared absorption spectra of the polymer revealed absorption at 800 cm$^{-1}$ due to the presence of disubstituted phenyl and absorption at 2,200 cm$^{-1}$ due to the presence of the methylene group of the chloromethylene group, thus confirming chloromethylation. Elemental analysis of the polymer revealed that the polymer had a degree of chloromethylation of 45%. The polymer had a weight average molecular weight $\overline{Mw}$ of $4.2 \times 10^4$ and a molecular weight distribution $\overline{Mw}/\overline{Mn}$ of 1.3.

WORKING EXAMPLE 12

Six grams of the diphenylsiloxane polymer prepared in Working Example 10 were dissolved in 20 ml of chloroform. After adding 0.04 g of ferric chloride and 0.01 g of iodine to the solution mixture, 9.9 g of chlorine gas was blown into the solution mixture for 24 hours. After the reaction, a white, chlorinated diphenylsiloxane polymer was obtained. The polymer had a chlorine content of 36%, a weight average molecular weight $\overline{Mw}$ of $2.2 \times 10^4$ and a molecular weight distribution $\overline{Mw}/\overline{Mn}$ of 1.2.

WORKING EXAMPLE 13

Ten grams of the diphenylsiloxane polymer prepared in Working Example 10 were dissolved in 50 ml of chloroform. After adding 2 g of ferric chloride, 16 g of bromine were added dropwise for 4 hours to the solution mixture. After leaving the solution mixture to stand for one day, the solution mixture was poured into methanol, and a pale brown brominated diphenylsiloxane polymer was obtained. The polymer had a degree of bromination of 35%, a weight average molecular weight $\overline{Mw}$ of $3.2 \times 10^4$, and a molecular weight distribution $\overline{Mw}/\overline{Mn}$ of 1.2.

WORKING EXAMPLE 14

Five-point-two grams of the diphenylsiloxane prepared in Working Example 10 were dissolved in 150 ml of nitrobenzene. After adding 5.1 g of iodine, 1.9 g of iodic acid, 5 ml of carbon tetrachloride, 5 ml of highly concentrated sulfuric acid, and 5 ml of water, the resultant mixture was stirred at 90° C. for 35 hours. After the reaction, the mixture was poured into methanol containing a small amount of diluted sulfuric acid. A pale yellow iodinated diphenylsiloxane polymer in a cotton like form was obtained. The polymer had a degree of iodination of 50%, a weight average molecular weight $\overline{Mw}$ of $4.5 \times 10^4$, and a molecular weight distribution $\overline{Mw}/\overline{Mn}$ of 1.2.

WORKING EXAMPLE 15

Thirty grams of the chloromethylated diphenylsiloxane polymer prepared in Working Example 11 were dissolved together with 36 g of potassium bromide in 150 ml of N,N-dimethylformamide. After stirring the mixture at 80° C. for 4 hours, a large amount of a water-methanol mixture was poured into the mixture, leaving a bromomethylated diphenylsiloxane polymer as a precipitate. Substantially 100% of chloromethyl groups of the polymer had been converted into bromomethyl groups. The polymer had a weight average molecular weight $\overline{Mw}$ of $5.0 \times 10^4$ and a molecular weight distribution $\overline{Mw}/\overline{Mn}$ of 1.3.

WORKING EXAMPLE 16

Thirty grams of the chloromethylated diphenylsiloxane polymer prepared in Working Example 11 were dissolved together with 55 g of potassium iodide into 150 ml of N,N-dimethylformamide. An iodomethylated diphenylsiloxane polymer was prepared following the procedures of Working Example 15. The polymer had a weight average molecular weight $\overline{Mw}$ of $6.2 \times 10^4$ and a molecular weight distribution $\overline{Mw}/\overline{Mn}$ of 1.3.

WORKING EXAMPLE 17

Thirty grams of the chloromethylated diphenylsiloxane polymer prepared in Working Example 11 were dissolved in 150 ml of pyridine. 0.25 mole of acrylic acid was added dropwise to the mixture at 10° C. over 3 hours, and the resultant mixture was left to stand for 3 hours. After the reaction, the mixture was poured into methanol to provide an acryloyloxy methylated diphenylcyclosiloxane polymer as a precipitate. The polymer had a weight average molecular weight $\overline{Mw}$ of $4.8 \times 10^4$ and a molecular weight distribution $\overline{Mw}/\overline{Mn}$ of 1.3.

WORKING EXAMPLE 18

0.25 mole of methacrylic acid was added dropwise in the same manner as in Working Example 17 to obtain a methacryloyloxy methylated diphenylsiloxane polymer. The polymer had a weight average molecular weight $\overline{Mw}$ of $5.2 \times 10^4$ and a molecular weight distribution $\overline{Mw}/\overline{Mn}$ of 1.3.

WORKING EXAMPLE 19

0.25 mole of calcium cinnamate was added dropwise in the same manner as in Working Example 17 to obtain a cinnamoyloxy methylated diphenylsiloxane polymer. The polymer had a weight average molecular weight $\overline{Mw}$ of $5.9 \times 10^4$ and a molecular weight distribution $\overline{Mw}/\overline{Mn}$ of 1.3.

EXAMPLE 15

A high-energy radiation-sensitive material prepared in Working Examples 12 to 29 was dissolved in methyl isobutyl ketone, and the resultant solution was applied on a silicon wafer to a thickness of about 0.5 μm. The coated film was prebaked in a nitrogen flow at 100° C. for 20 minutes. The wafer was then irradiated with an electron beam at an acceleration voltage of 20 kV. The radiation pattern was a pattern for obtaining a sensitivity curve. The wafer was then developed in a solvent mixture of methyl ethyl ketone:isopropyl alcohol (4:1), and was rinsed in isopropyl alcohol. Table 9 shows the electron beam dose at which 50% of the initial film thickness remained as an index of sensitivity, and the γ-value as an index of resolution.

TABLE 9

| Sample | 12 | 13 | 14 | 15 | 16 | 17 | 18 | 19 |
|---|---|---|---|---|---|---|---|---|
| Sensitivity $D_{50}$ (μC/cm³) | 6 | 20 | 12 | 16 | 10 | 2 | 3 | 5 |
| γ-value | 2.6 | 2.5 | 2.3 | 2.8 | 2.4 | 1.2 | 1.5 | 2.0 |

A pattern for evaluating the resolution was irradiated with an electron beam and was developed. Table 13 below shows a mimimum line/space which allowed resolution without forming a residue or bridge.

TABLE 10

| Sample | 12 | 13 | 14 | 15 | 16 | 17 | 18 | 19 |
|---|---|---|---|---|---|---|---|---|
| Minimum pattern size (μm) | 0.5 | 0.5 | 0.5 | 0.4 | 0.5 | 1.0 | 1.0 | 0.8 |

EXAMPLE 16

AZ-1350 resist (Shipley Co., Inc.) was applied to a thickness of 2 μm on a silicon wafer and the wafer was heated at a temperature of 200° C. for 30 minutes. A high-energy radiation-sensitive material used in Example 15 was coated thereon in the same manner as in Example 15 to a thickness of about 0.3 m. The wafer was prebaked at 100° C. in a nitrogen flow for 20 minutes. After prebaking, the wafer was irradiated with an electron beam at an acceleration voltage of 20 kV. The wafer was developed in a solvent mixture of methyl ethyl ketone:isobutyl alcohol (4:1), and was rinsed in isopropyl alcohol. A 0.3 μm line/space pattern was thus formed on the AZ resist. Etching was performed in an oxygen gas using a parallel plate-type sputtering apparatus (excluding the materials of Working Examples 17, 18 and 19) at an application power of 50 W, an etching chamber pressure of 80 millitorr, and an oxygen gas flow rateof 50 msec. Under these etching conditions, the etch rate of the radiation-sensitive siloxane polymer was substantially zero. The etch rate of the AZ resist was 800 Å/min, and the AZ resist was completely etched away in 28 minutes. After the etching process, a 0.3 μm line/space pattern was formed to have a thickness of 2.3 μm.

For the materials of Working Examples 17, 18 and 19, a 0.7 μm line/space pattern was formed on the AZ resist. The AZ resist was etched in oxygen gas by the method as described above. A 0.7 μm line/space pattern was formed to have a thickness of 2.3 μm after etching.

EXAMPLES 17–19

In the method of Example 15, an X-ray (Example 17), a far ultraviolet ray (Example 18), and an ion beam (Example 19) were used in place of an electron beam. Table 11 shows the energy beam dose at which 50% of the initial film thickness remained.

TABLE 11

| Example | Radiation source | Sample 12 | 13 | 14 | 15 | 16 |
|---|---|---|---|---|---|---|
| 17 | X-ray/CuL ray: 13.3 Å (mJ/cm²) | 100 | 250 | 180 | 210 | 150 |
| 18 | Deep ultraviolet: 1 kW Xe-Hg lamp (mJ/cm²) | 52 | 140 | 92 | 105 | 75 |
| 22 | Ion beam Ga: 34 kV (μC/cm²) | 1.0 | 3.0 | 2.0 | 2.5 | 1.5 |

The high-energy radiation-sensitive materials used were those used in Examples 12, 13, 14, 15 and 16.

EXAMPLE 20

Irradiation with an ultra high-voltage mercury lamp was performed in place of irradiation with an electron beam in the method of Example 15. Table 12 shows the minimum dose at which 100% of the initial thickness was exposed.

TABLE 12

| Sample | 17 | 18 | 19 |
|---|---|---|---|
| Minimum Dose (mJ/cm²) | 10 | 25 | 50 |

A high-energy radiation-sensitive material obtained in Working Examples 12 to 16 had a low sensitivitity and did not form a pattern at a dose of 3 J/cm² or more.

In the above Examples, chlorine, bromine and iodine are used as halogen elements. However, it is to be understood that a similar effect may be obtained with fluorine.

A silicone based resin, that is, a siloxane polymer, obtained in accordance with the present invention has a higher glass transition temperature than that of a conventional silicone based resin, and has a high sensitivity to and a high resolution under high-energy radiation. Since a cyclic siloxane monomer can be subjected to living polymerization, a resist material which has a small molecular weight distribution, that is, a high resolution, can be obtained. The resin of the present invention is in a white powdery form, has a good solubility, and a good coating property by spin coating. The resin of the present invention is thus easy to handle as compared with a conventional substantially liquid silicone based resin.

If the resin of the present invention is used as an upper layer of a bilayered resist having a thick organic lower layer, a submicron pattern having a very high aspect ratio can be formed.

The above advantages of the resin of the present invention contribute much to the manufacturing techniques of semiconductor elements and the like.

In a conventional negative resist, a bridge or the like is easily formed due to proximity effect, swelling during development and the like. When such a resist is micronized, desired fine patterning cannot be achieved. However, the resin of the present invention is not liable to such proximity effect and swelling, and thus has a high resolution. This effect is particularly notable when the resist has a bilayered structure. Manufacture of a bilayered structure requires a smaller number of manufacturing steps and a shorter manufacturing time as compared to manufacture of a multilayered structure having three or more layers. In a conventional multilayered structure, a thick film pattern cannot be formed with a high resolution since the upper layer resist has a low resolution and a low dry etching resistance. However, when the resist of the present invention is used, a pattern of a high resolution and a high aspect ratio can be formed. Accordingly, a pattern which has a sufficient thickness to allow pattern covering of a step or to allow high-speed ion-implantation, and which has at the same time a high resolution, can be formed in a short period of time and at low cost with a resist of the present invention.

What is claimed is:

1. A pattern forming material containing a siloxane polymer having the general formula:

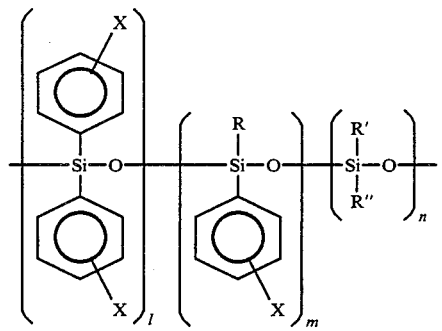

[wherein R, R' and R" are the same or different and are respectively one member selected from the group consisting of hydrogen, an alkyl group and a phenyl group; X is one member selected from the group consisting of fluorine, chlorine, bromine, iodine and a —$CH_2Y$ group (wherein Y is one member selected from the group consisting of chlorine, fluorine, bromine, iodine, an acryloyloxy group, a methacryloyloxy group, and a cinnamoyloxy group); and l, m and n are respectively 0 or a positive integer, l and m not being simultaneously 0].

2. A material according to claim 1, wherein a phenyl group content is not less than 75% of side chain residues.

3. A material according to claim 1, wherein X is —$CH_2Cl$ in the general formula.

4. A material according to claim 1, wherein the siloxane polymer is prepared by reacting one member selected from the group consisting of a phenyl group-containing siloxane oligomer and a phenyl group-containing polysiloxane having a low molecular weight with one member selected from the group consisting of X in the general formula and a compound containing X in the general formula under the presence of a Friedel-Crafts catalyst.

5. A material according to claim 3, wherein the siloxane polymer is prepared by reacting one member selected from the group consisting of a phenyl group-containing siloxane oligomer and a phenyl group-containing polysiloxane having a low molecular weight with a chloromethyl lower alkyl ether under the presence of a Friedel-crafts catalyst.

6. A material according to claim 5, wherein the chloromethyl lower alkyl ether is one member selected from the group consisting of chloromethyl methyl ether and chloromethyl ethyl ether.

* * * * *